(12) United States Patent
Tekumalla et al.

(10) Patent No.: US 8,726,108 B2
(45) Date of Patent: *May 13, 2014

(54) SCAN TEST CIRCUITRY CONFIGURED FOR BYPASSING SELECTED SEGMENTS OF A MULTI-SEGMENT SCAN CHAIN

(75) Inventors: Ramesh C. Tekumalla, Breinigsville, PA (US); Prakash Krishnamoorthy, Bethlehem, PA (US); Niranjan Anant Pol, Pune (IN); Vineet Sreekumar, Mumbai (IN)

(73) Assignee: LSI Corporation, San Jose, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 13/348,979

(22) Filed: Jan. 12, 2012

(65) Prior Publication Data

US 2013/0185607 A1 Jul. 18, 2013

(51) Int. Cl.
*G01R 31/28* (2006.01)
(52) U.S. Cl.
USPC .......................... 714/726; 714/729; 714/740
(58) Field of Classification Search
USPC ................... 714/726, 729, 731, 740
See application file for complete search history.

(56) References Cited

U.S. PATENT DOCUMENTS

| | | | |
|---|---|---|---|
| 5,390,190 A | 2/1995 | Nanda et al. | |
| 5,719,879 A * | 2/1998 | Gillis et al. | 714/726 |
| 5,872,793 A * | 2/1999 | Attaway et al. | 714/726 |
| 5,909,451 A | 6/1999 | Lach et al. | |
| 6,314,539 B1 * | 11/2001 | Jacobson et al. | 714/727 |
| 7,246,282 B2 | 7/2007 | Chau et al. | |
| 7,373,568 B1 | 5/2008 | Horovitz | |
| 7,613,967 B1 | 11/2009 | Tan | |
| 7,734,974 B2 | 6/2010 | Aitken et al. | |
| 7,831,876 B2 | 11/2010 | Goyal et al. | |
| 2005/0055615 A1 | 3/2005 | Agashe et al. | |
| 2005/0262409 A1 | 11/2005 | Wang et al. | |
| 2007/0186132 A1 | 8/2007 | Dingemanse | |

(Continued)

FOREIGN PATENT DOCUMENTS

JP 2008275480 A 11/2008

OTHER PUBLICATIONS

X. Chen et al., "An Overlapping Scan Architecture for Reducing Both Test Time and Test Power by Pipelining Fault Detection," IEEE Transactions on Very Large Scale Integration (VLSI) Systems, Apr. 2007, pp. 404-412, vol. 15, No. 4.

(Continued)

*Primary Examiner* — Fritz Alphonse
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises at least one scan chain having a plurality of scan cells, wherein the scan chain is separated into a plurality of scan segments with each such segment comprising a distinct subset of two or more of the plurality of scan cells. The scan test circuitry further comprises scan segment bypass circuitry configured to selectively bypass one or more of the scan segments in a scan shift mode of operation. The scan segment bypass circuitry may comprise a plurality of multiplexers and a scan segment bypass controller. The multiplexers are arranged within the scan chain and configured to allow respective ones of the scan segments to be bypassed responsive to respective bypass control signals generated by the scan segment bypass controller.

20 Claims, 5 Drawing Sheets

(56) References Cited

U.S. PATENT DOCUMENTS

2007/0245180 A1    10/2007   Li
2008/0126898 A1    5/2008   Pandey
2010/0188096 A1    7/2010   Waayers et al.

OTHER PUBLICATIONS

N. Badereddine et al., "Minimizing Peak Power Consumption During Scan Testing: Test Pattern Modification with X Filling Heuristics," International Conference on Design and Test of Integrated Systems (DTIS) in Nanoscale Technology, Sep. 2006, pp. 359-364.

J.T. Tudu et al., "On Minimization of Peak Power for Scan Circuit During Test," IEEE European Test Symposium, May 2009, pp. 25-30.

Patrick Girard, "Survey of Low-Power Testing of VLSI Circuits," IEEE Design & Test of Computers, May-Jun. 2002, pp. 82-92, vol. 19, No. 3.

Semiconductor Industry Association, "International Technology Roadmap for Semiconductors," http://www.itrs.net/Links/2005ITRS/Test2005.pdf, 2005, pp. 1-52.

R. Sankaralingam et al., "Reducing Power Dissipation During Test Using Scan Chain Disable," 19th IEEE Proceedings on VLSI Test Symposium (VTS), Apr.-May 2001, pp. 319-324.

V.R. Devanthan et al., "PMScan: A Power-Managed Scan for Simultaneous Reduction of Dynamic and Leakage Power During Scan Test," IEEE International Test Conference (ITC), Paper 13.3, Oct. 2007, 9 pages.

S. Hatami et al., "A Low-Power Scan-Path Architecture," IEEE International Symposium on Circuits and Systems (ISCAS), May 2005, pp. 5278-5281, vol. 5.

S.T. Arusu et al., "A Low Power and Low Cost Scan Test Architecture for Multi-Clock SoCs Using Virtual Divide and Conquer," IEEE International Test Conference (ITC), Nov. 2005, 9 pages.

I. Bayraktaroglu et al., "Test Volume and Application Time Reduction Through Scan Chain Concealment," Design Automation Conference, Jun. 2001, pp. 151-155.

Y. Bonhomme et al., "An Efficient Scan Tree Design for Test Time Reduction," Ninth IEEE European Test Symposium (ETS), May 2004, pp. 174-179.

Y. Cho et al., "On Reducing Test Application Time for Scan Circuits Using Limited Scan Operations and Transfer Sequences," IEEE Transactions on Computer-Aided Design of Integrated Circuits and Systems, Oct. 2005, pp. 1594-1605, vol. 24, No. 10.

O. Sinanoglu, "Construction of an Adaptive Scan Network for Test Time and Data Volume Reduction," Computers & Digital Techniques, Jan. 2008, pp. 12-22, vol. 2, No. 1.

P. Shanmugasundaram et al., "Dynamic Scan Clock Control for Test Time Reduction Maintaining Peak Power Limit," 29th IEEE VLSI Test Symposium (VTS), May 2011, pp. 248-253.

U.S. Appl. No. 13/280,797 filed in the name of R.C. Tekumalla et al. on Oct. 25, 2011 and entitled "Dynamic Clock Domain Bypass for Scan Chains."

\* cited by examiner

US 8,726,108 B2

SCAN TEST CIRCUITRY CONFIGURED FOR BYPASSING SELECTED SEGMENTS OF A MULTI-SEGMENT SCAN CHAIN

BACKGROUND

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. Additional details regarding compressed scan testing are disclosed in U.S. Pat. No. 7,831,876, entitled "Testing a Circuit with Compressed Scan Subsets," which is commonly assigned herewith and incorporated by reference herein.

Nonetheless, in both compressed and noncompressed scan testing, there remains a need for further improvements in scan testing performance. For example, integrated circuit power consumption during scan testing is often significantly higher than during functional operation. This is due primarily to increased switching activity during scan testing as compared to functional operation. Excessive power dissipation during scan test can result in large voltage variations, reduced noise margins and other signal integrity issues which could lead to premature chip failure, thereby adversely impacting yield.

SUMMARY

One or more illustrative embodiments of the invention provide a substantial improvement in scan testing through the use of scan segment bypass circuitry configured to bypass selected segments of a multi-segment scan chain during scan testing, such that power consumption and test time can be reduced.

In one embodiment, an integrated circuit comprises scan test circuitry and additional circuitry subject to testing utilizing the scan test circuitry. The scan test circuitry comprises at least one scan chain having a plurality of scan cells. The scan chain is separated into a plurality of scan segments with each such segment comprising a distinct subset of two or more of the plurality of scan cells. The scan test circuitry further comprises scan segment bypass circuitry configured to selectively bypass one or more of the scan segments in a scan shift mode of operation.

The scan segment bypass circuitry may comprise a plurality of multiplexers and a scan segment bypass controller. For example, the multiplexers may be arranged within the scan chain and configured to allow respective ones of the scan segments to be bypassed responsive to respective bypass control signals generated by the scan segment bypass controller. A given one of the multiplexers may comprise a first input coupled to a scan input of a corresponding one of the scan segments, a second input coupled to a scan output of the corresponding one of the scan segments, an output coupled to a scan input of a subsequent scan segment of the scan chain, and a select line adapted for receiving a bypass control signal for controlling the multiplexer between at least a first state in which the corresponding scan segment is not bypassed and a second state in which the corresponding scan segment is bypassed.

The scan segment bypass controller may comprise a finite state machine. The finite state machine comprise a plurality of states including a reset state in which none of the scan segments is bypassed and a plurality of additional states in which respective ones of the scan segments are bypassed.

Scan test circuitry comprising scan segment bypass circuitry in one or more of the illustrative embodiments exhibits reduced power consumption and test time without any performance degradation and without requiring significant changes to the integrated circuit design. Particularly efficient test patterns can be generated to exploit the scan segment bypass functionality.

DETAILED DESCRIPTION

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by selectively bypassing one or more scan segments of a scan chain during scan testing.

Figure 1:
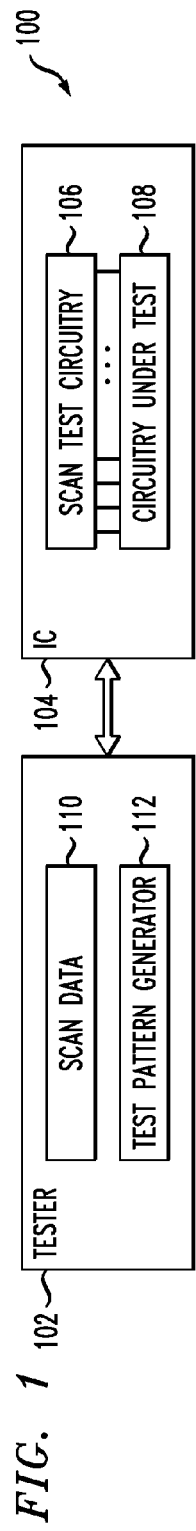
FIG. 1 is a block diagram showing an integrated circuit testing system comprising a tester and an integrated circuit under test in an illustrative embodiment.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Figure 2:
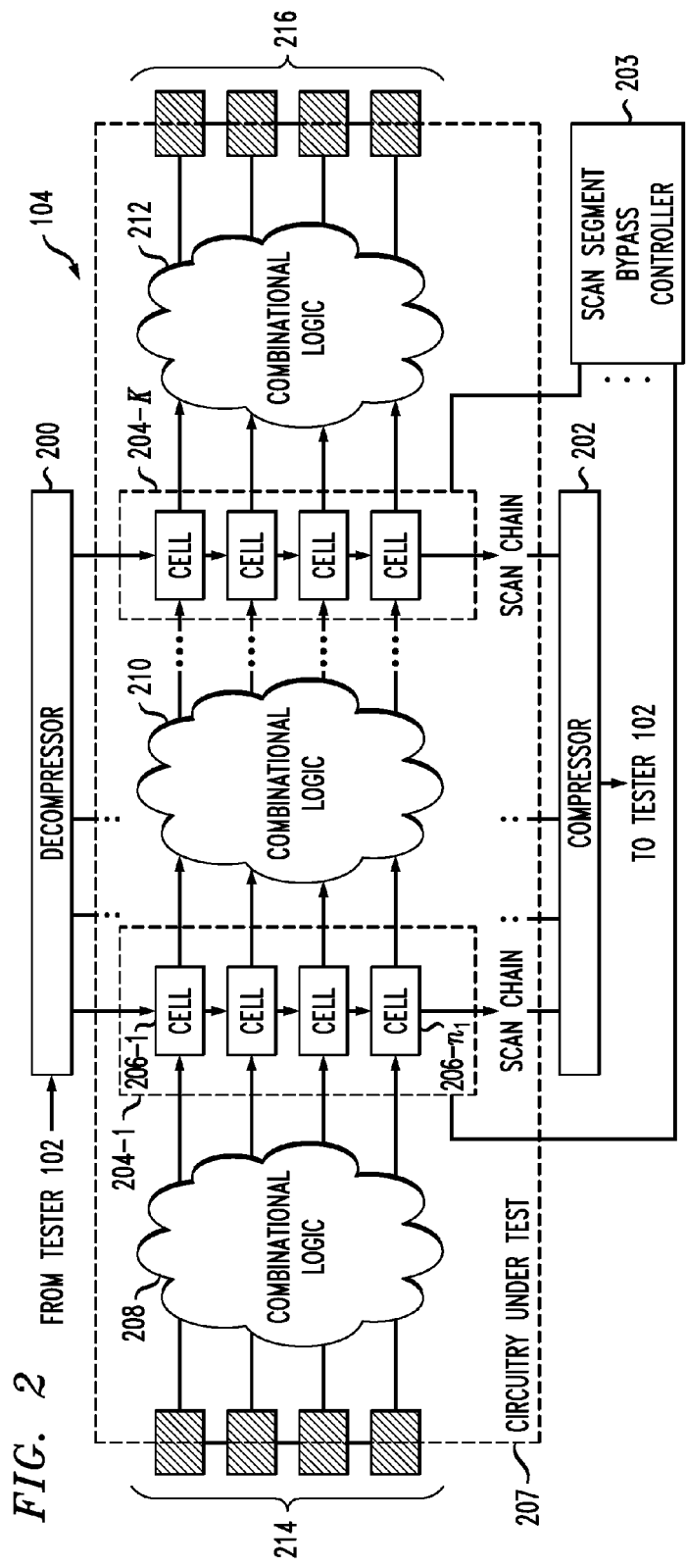
FIG. 2 illustrates one example of the manner in which scan chains of scan test circuitry may be arranged between combinational logic in the integrated circuit of FIG. 1.

Referring now to FIG. 2, portions of one potential configuration of the integrated circuit 104 are shown in greater detail. In this compressed scan testing arrangement, the scan test circuitry 106 comprises a decompressor 200, a compressor 202, a scan segment bypass controller 203 and a plurality of scan chains 204-$k$, where $k=1, 2, \ldots K$.

Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The scan chains 204 may be associated with one or more distinct clock domains, or a single clock domain.

As will be described in greater detail below, one or more of the scan chains 204 are each separated into multiple scan segments, with each such scan segment comprising a distinct subset of two or more of the scan cells of the corresponding chain. The scan test circuitry 106 comprises scan segment bypass circuitry configured to selectively bypass one or more of the scan segments in a scan shift mode of operation. The scan segment bypass circuitry in one or more embodiments comprises scan segment bypass controller 203 and associated multiplexing circuitry arranged within the scan chains.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length, such that $n_1 = n_2 = \ldots = n_k$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in the above-cited U.S. Pat. No. 7,831,876. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern.

Embodiments of the invention are configured to permit segments of one or more of the scan chains 204 to be selectively bypassed during scan testing, in a manner that can reduce power consumption as well as test time.

The scan test circuitry 106 provides this scan segment bypass functionality through the use of scan segment bypass circuitry illustratively comprising scan segment bypass controller 203 and associated multiplexing circuitry arranged within the scan chains 204, as will be described below in conjunction with FIGS. 3, 4 and 5.

Figure 3A:
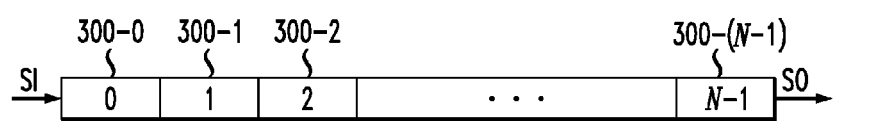
FIGS. 3A, 3B and 3C illustrate the separation of scan chains into segments and also illustrate associated scan segment bypass circuitry comprising multiplexers and a scan segment bypass controller. These figures may be collectively referred to herein as FIG. 3.

FIG. 3A shows one of the scan chains 204-1 of the scan test circuitry 106 of FIG. 2. The scan chain 204-1 is separated into N scan segments 300-0 through 300-(N−1), with each such scan segment comprising two or more of the scan cells 206 of that scan chain. In a scan shift mode of operation, the scan chain 204-1 may be viewed as having a scan input (SI) at segment 300-0 and a scan output (SO) at segment 300-(N−1). Each of the other scan chains 204 of the scan test circuitry 106 may be configured in a similar manner. Alternatively, only a subset of the scan chains 204 may be separated into scan segments. As will be described, scan testing power consumption can then be reduced by selectively suppressing the scan shift through at least one scan segment in each scan chain.

The grouping of scan cells 206 of the scan chains 204 into scan segments may be based on the clock domain to which the scan cells belong, or other additional or alternative factors. For example, each of the N scan segments shown in FIG. 3A may correspond to a different clock domain of the integrated circuit 104.

As a more particular example of a scan chain segmentation process for separating scan chains 204 into scan segments, assume that all of the scan chains are separated in substantially the same manner, and that after an initial separation of each scan chain into N scan segments the average length of the N segments is L. For each segment in each chain, if its length is more than L, the segment may be further split into n*L+m segments, where n is the number of sub-segments of length L and where m<L. The remaining m scan cells are then added into the next segment. At the end of this process, all the segment lengths are balanced in each scan chain, with the exception of the last segment in each chain, which has a length of at most L. Also, a segment now may have more than one clock domain. In such a situation, lockup latches may be used between clock domain crossings within a segment.

Figure 3B:
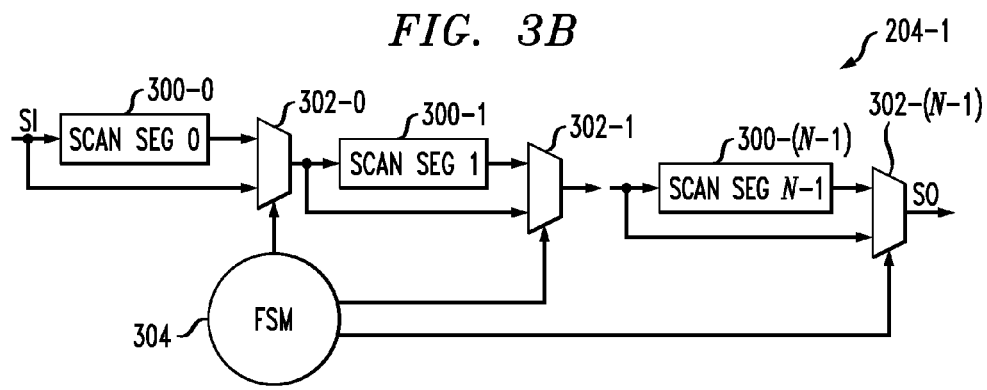

Referring now to FIG. 3B, portions of the scan segment bypass circuitry are shown in greater detail. As shown, the scan segment bypass circuitry comprises a plurality of multiplexers 302 arranged within the scan chain 204-1 and configured to allow respective ones of the scan segments 300 to be bypassed responsive to respective bypass control signals under the control of a finite state machine (FSM) 304. Each of the scan segments 300 of the scan chain 204-1 in the present embodiment may be assumed to have a length in scan cells that is less than or equal to a specified maximum segment length L, based on application of the previously-described scan chain segmentation process.

In this embodiment, each of the multiplexers 302 comprises a two-to-one multiplexer having a first input coupled to a scan input of a corresponding one of the scan segments 300, a second input coupled to a scan output of the corresponding one of the scan segments, and a select line adapted for receiving a bypass control signal for controlling the multiplexer between at least a first state in which the corresponding scan segment is not bypassed and a second state in which the corresponding scan segment is bypassed.

The output of each multiplexer 302 other than a final multiplexer 302-(N−1) of the scan chain 204-1 is coupled to a scan input of a subsequent scan segment of that scan chain. Thus, for example, multiplexer 302-0 has a first input coupled to a scan input of scan segment 300-0, a second input coupled to a scan output of scan segment 300-0, and an output coupled to a scan input of the next scan segment 300-1 in the scan chain 204-1. Similarly, multiplexer 302-(N−1) has a first input coupled to a scan input of scan segment 300-(N−1), and a second input coupled to a scan output of scan segment 300-(N−1). However, as the multiplexer 302-(N−1) is the final multiplexer of the scan chain 204-1, the output of the multiplexer 302-(N−1) is coupled to the compressor 202 rather than to a subsequent scan segment.

The multiplexing circuitry illustrated in the embodiment of FIG. 3B allows multiple segments in a given scan chain to be bypassed at the same time without breaking the integrity of the scan chain.

Figure 3C:
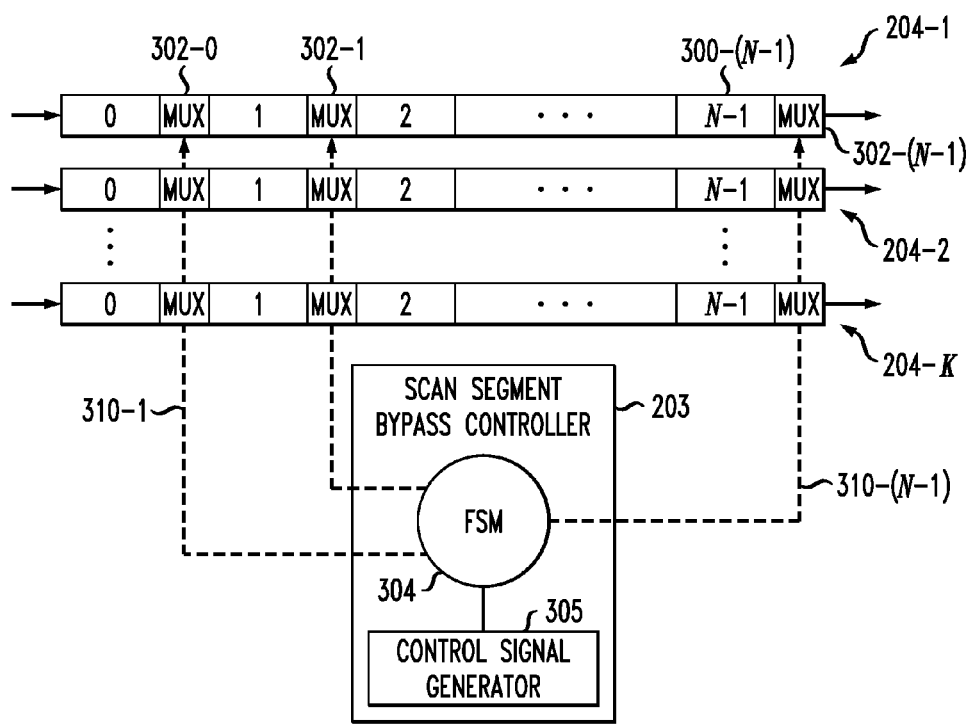

As illustrated in FIG. 3C, the finite state machine 304 may be part of the scan segment bypass controller 203, which in this embodiment further comprises a control signal generator 305. The scan segment bypass controller 203 is configured to generate the bypass control signals for application to the multiplexers 302. It is further assumed in this embodiment that each of the scan chains 204 is separated in scan segments in substantially the same manner, as shown in FIG. 3C. Thus, the multiplexers are in similar positions within each of the scan chains, and all are controlled by the scan segment bypass controller 203 utilizing finite state machine 304 and control signal generator 305. More particularly, in this embodiment the bypass multiplexers for the corresponding segments in all of the chains 204 are controlled using the same output from the finite state machine 304. Thus, a first output 310-1 of the finite state machine 304 controls the first set of vertically-aligned multiplexers for bypassing respective first segments of the scan chains 204. Similarly, a final output 310-(N−1) of the finite state machine 304 controls the final set of vertically-aligned multiplexers for bypassing respective final segments of the scan chains 204.

Although in this embodiment all of the corresponding segments in each scan chain 204 are controlled by the same output of the controller 203, this is by way of illustrative example only, and in other embodiments each segment may be controlled by a unique output of the controller 203. Numerous other mappings of scan segments to control outputs or other control signals may be used in other embodiments.

Figure 4:
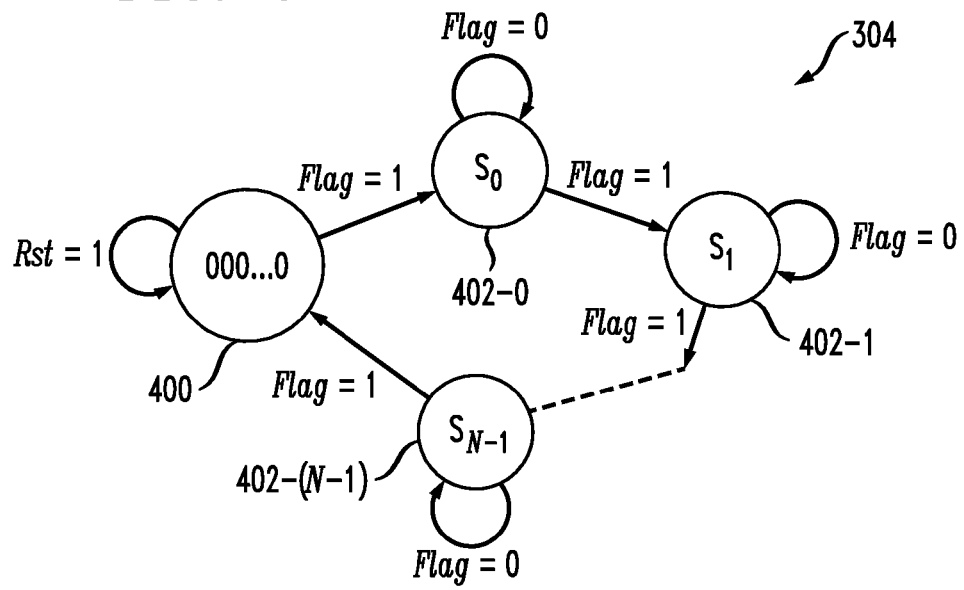
FIG. 4 is a state diagram of a finite state machine implemented in the scan segment bypass controller of FIG. 3.

FIG. 4 shows one possible implementation of the finite state machine 304 in greater detail. The finite state machine as shown comprises a plurality of states including a reset state 400 in which none of the scan segments 300 of a given scan chain such as scan chain 204-1 is bypassed and a plurality of additional states 402-1, 402-2, . . . 402-(N−1) in which respective ones of the scan segments of that scan chain are bypassed. The reset state 400 is a default state in which the outputs of the finite state machine are all at logic 0 levels such that none of the segments of the corresponding scan chain are bypassed.

The finite state machine 304 may be configured to cycle through the states responsive to one or more control signals from the control signal generator 305 of the scan segment bypass controller 203. In this embodiment, the control signals include signals denoted Rst and Flag. The finite state machine 304 enters and remains in the reset state 400 responsive to assertion of the Rst signal. A given assertion of the Flag signal causes the state machine to move from one state to the next state in the cycle.

The additional states 402-1, 402-2, . . . 402-(N−1) are also denoted $S_0, S_1, \ldots S_{N-1}$, respectively, and in each such state a different one of the outputs of the finite state machine is at a logic 1 level rather than a logic 0 level, thereby causing the corresponding multiplexer to bypass its associated scan segment. Accordingly, each of the additional states 402 in this embodiment causes a different one of the scan segments of a given scan chain to be bypassed. The Flag signal may be configured to cause the finite state machine to move from state to state only after application of a particular number of test patterns to the scan chain within a given such state, such as two test patterns. Each of the states of the finite state machine in this embodiment provides a number of outputs that corresponds to the number of scan segments N in each scan chain 204. These outputs may be single-bit outputs, with each such single-bit output being applied to the select line of a corresponding one of the multiplexers in each of the scan chains. Such outputs may be considered examples of what are more generally referred to herein as "bypass control signals."

As noted above, none of the scan segments is bypassed when the finite state machine 304 is in the reset state 400. Accordingly, the scan segment bypass functionality of the scan test circuitry 106 can be made inactive by keeping the Rst signal asserted. The scan chains 204 can therefore be operated with no bypassing of scan segments, or with selective bypassing of one or more segments of each chain. When the Rst signal is deasserted, the finite state machine moves from the reset state 400 to the state $S_1$ which causes the first segment in all of the scan chains 204 to be bypassed.

The finite state machine 304 will move to state $S_2$ to cause the second segment in all of the scan chains to be bypassed after two test patterns are generated in state $S_1$, although different numbers of test patterns or more generally other state transition timing arrangements may be used in other embodiments. This process repeats until the state machine cycles through all of its states comes back to the reset state. The number of test patterns in each state may be a user-configurable parameter of the scan test circuitry 106. Thus, for example, a given user may opt to use different numbers of one or more test patterns in each of at least a subset of the states, or the same number of patterns in all of the states.

In the embodiment illustrated in FIG. 3C, the scan chain segmentation process provides an equal number N of scan segments in each scan chain, resulting in an N×K array of N segments for the K scan chains 204. The finite state machine 304 cycles through each segment of the K scan chains and controllably bypasses the same segment in each scan chain, one at a time. The size of the finite state machine depends on the number of scan segments per scan chain and hence it is not affected by the overall size of the integrated circuit design and the number of scan chains.

The finite state machine 304 is configured to bypass only a single scan segment in each scan chain at any given time. However, other embodiments can be configured to bypass two or more scan segments in each scan chain at one time. Thus, for example, the finite state machine can be altered such that two or more of its outputs are at logic 1 levels at the same time and these outputs will set the select lines of the corresponding multiplexers such that the two or more intended segments on each scan chain are bypassed.

Figure 5:
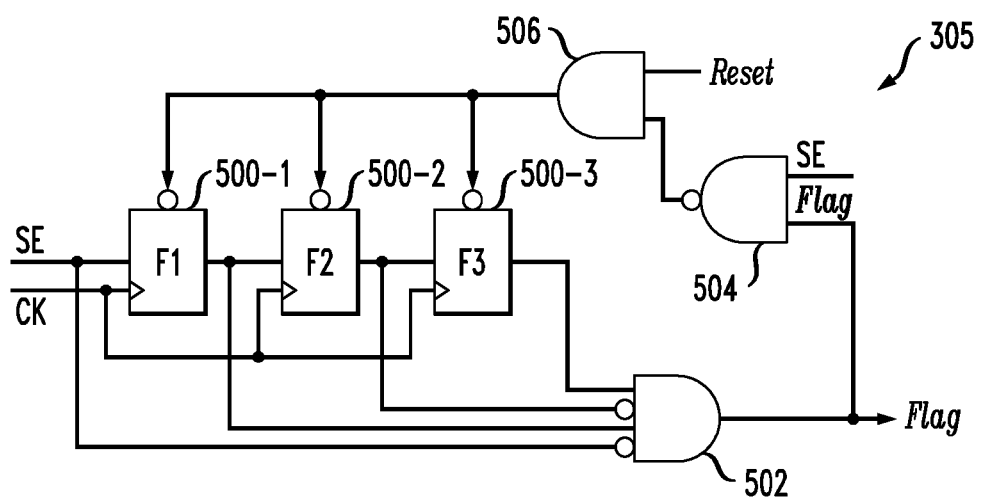
FIG. 5 is a schematic diagram of a state machine control signal generator in the scan segment bypass controller of FIG. 3.

FIG. 5 shows circuitry that may be used to generate the Flag signal for controlling the operation of the finite state machine 304. The circuitry is assumed to be part of the control signal generator 305, but may be incorporated in whole or in part in other system components in other embodiments. The circuitry is clocked by a clock signal CK that may be supplied from a chip-level pin or other suitable clock source. The circuitry includes three flip-flops 500-1, 500-2 and 500-3, also denoted F1, F2 and F3, a four-input AND gate 502, a two-input NAND gate 504, and a two-input AND gate 506. This circuitry is configured to track the number of test patterns that are generated when the finite state machine is in a particular state. More particularly, it counts two clock pulses and outputs a logic high Flag signal when two test patterns have been generated.

In addition to the CK input, the circuitry of FIG. 5 includes inputs for a scan enable signal denoted SE and a Reset signal. The SE signal input may be coupled, for example, to a chip-level SE signal pin. The output Flag signal serves as the input to the finite state machine 304. The Reset signal when asserted sets the outputs of the flip-flops 500 to logic 0 levels such that Flag=0. It should be noted that the flip-flops 500 can also be reset when Flag and SE are set to logic 1 levels. In this circuitry, the only time that Flag=1 is when SE=0 and the output of F1=1, the output of F2=0 and the output of F3=1. This condition occurs after two test patterns are generated. After that SE becomes 1 so that the outputs of F1, F2 and F3=0 and Flag=0. This process continues for subsequent test patterns.

The scan segment bypass circuitry as described in conjunction with the embodiments of FIGS. 3, 4 and 5 allows scan segments to be selectively bypassed in a manner that can reduce both power consumption and test time in scan testing of the integrated circuit 104. The scan segment bypass circuitry is applicable for use in both compressed and noncompressed scan testing environments.

It is to be appreciated that the particular arrangements shown in FIGS. 3, 4 and 5 are presented by way of illustrative example only, and numerous alternative arrangements of scan segment bypass circuitry may be used to provide an ability to selectively bypass scan segments in the manner disclosed herein. This scan segment bypass functionality can be implemented in one or more of the illustrative embodiments without any significant negative impact on integrated circuit area requirements or functional timing requirements.

The presence of scan segment bypass circuitry as described above in conjunction with FIGS. 3, 4 and 5 within integrated circuit 104 may be made apparent to a test generation tool so that the tool can take the scan segment bypass functionality into account in generating test patterns. In order to accomplish this, one or more input files describing the operation of this circuitry may be provided to the test generation tool.

Figure 6:
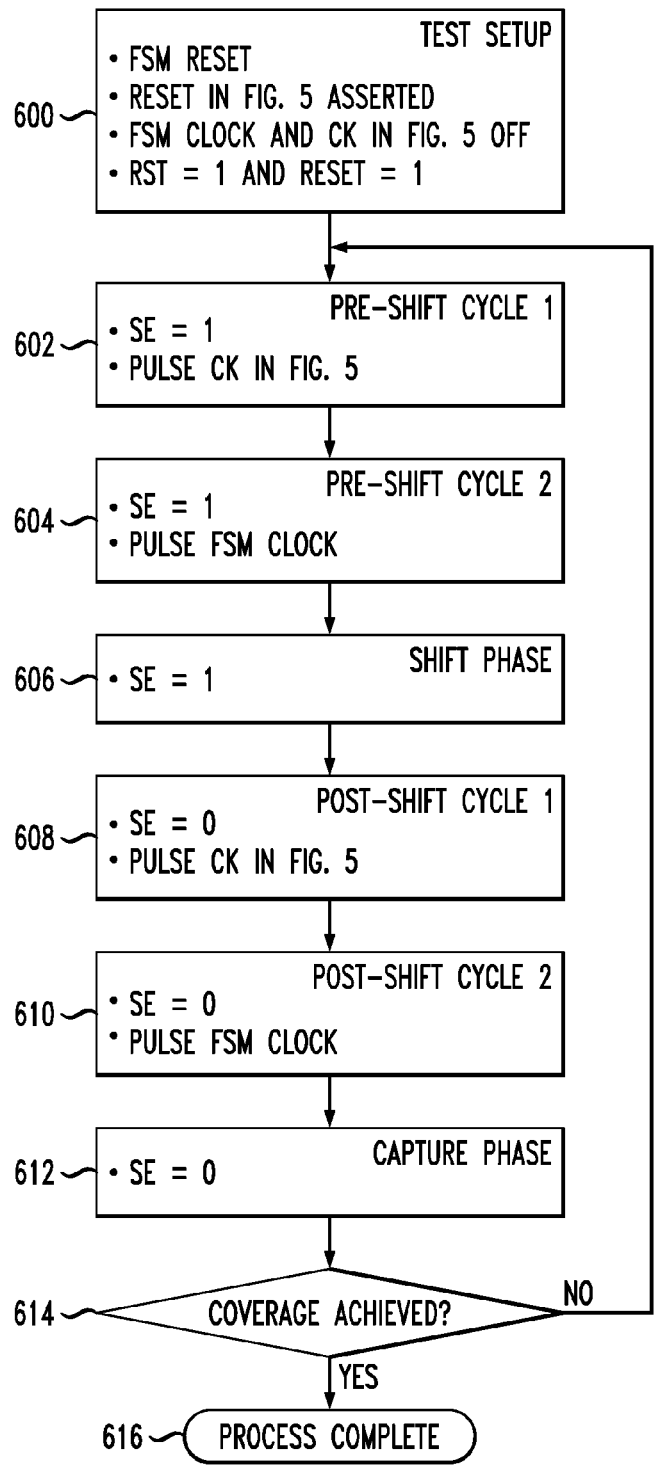
FIG. 6 is a flow diagram of a test generation process utilizing the scan segment bypass circuitry of FIGS. 3, 4 and 5.

FIG. 6 shows a test generation process utilizing the scan segment bypass circuitry. The process includes steps 600 through 614. It is assumed for this embodiment that separate reset signals denoted Rst and Reset are applied to the finite state machine 304 and the FIG. 5 circuitry, respectively, and furthermore that separate clock signals are applied to the finite state machine 304 and the FIG. 5 circuitry, although numerous other signaling arrangements could be used in other embodiments.

At the beginning of the test generation process, a test setup step 600 configures the integrated circuit 104 for scan testing using the scan segment bypass functionality. In this step, the finite state machine 304 and the FIG. 5 circuitry are reset by asserting their respective Rst and Reset signals. The outputs of flip-flops F1, F2 and F3=0. The clock signals applied to the finite state machine and the FIG. 5 circuitry are then shut off and their respective reset signals are deasserted.

The test pattern generation process then shifts data into all of the scan chains 204 using the steps 602 through 610 followed by capturing of the functional logic in step 612. These steps are repeated for multiple test patterns until a desired level of fault coverage is achieved. Before the actual scan shift phase starts in step 606 for a given test pattern, there are two additional tester clock cycles, denoted Pre-Shift Cycle 1 and Pre-Shift Cycle 2, in steps 602 and 604, respectively. In these two pre-shift cycles, SE=1. In the first pre-shift cycle in step 602, the clock of the FIG. 5 circuitry is pulsed and in the next pre-shift cycle in step 604, the clock of the finite state machine is pulsed.

After the shift phase in step 606 is complete, there are two more additional test cycles, denoted Post-Shift Cycle 1 and Post-Shift Cycle 2 in steps 608 and 610, respectively. In these two post-shift cycles, SE=0. In the first post-shift cycle in step 608, the clock of the FIG. 5 circuitry is pulsed and in the next cycle the clock of the finite state machine is pulsed. The process then goes through the capture phase in step 612 and then back to the two tester cycles in steps 602 and 604 before the shift phase in step 606. After step 612 and before return to step 602, a determination is made in step 614 as to whether or not the desired level of fault coverage has been achieved. If it has not been achieved, the test generation process returns to step 602 to be repeated for another test pattern as indicated, and otherwise the test generation process ends in step 616.

As indicated previously, steps 602 through 612 and the determination in step 614 are repeated for each of multiple test patterns. At a particular point during an iteration of the process, the Flag signal is asserted. This happens in the first post-shift cycle in step 608 after the shift phase in step 606. In the second post-shift cycle in step 610, the finite state machine clock is pulsed as described above and the state machine makes a state transition. After the capture phase of step 612 is completed, the SE signal is asserted in the first of the two tester cycles before the shift phase in step 606. This resets the flip-flops F1, F2 and F3 in FIG. 5 since at this point Flag=1. When the shift phase of step 606 starts, a particular one of the scan segments in each scan chain 204 will be bypassed, depending on the particular state that the finite state machine is in at that point.

In the FIG. 6 test generation process, the finite state machine is kept in a certain state for generation of multiple test patterns and then is permitted to go to the next state. Alternatively, the process could be configured such that the finite state machine changes state after every test pattern.

The particular test generation process shown in FIG. 6 should therefore be viewed as one example of a process that utilizes scan segment bypass circuitry as disclosed herein. In other embodiments, other processes may be used, including additional or alternative process steps. Also, the ordering of the steps may be varied in other embodiments, and two or more of the steps shown as being performed in series may instead be performed at least in part in parallel with one another.

As one example of an implementation of scan chain circuitry in an illustrative embodiment, a given integrated circuit design may comprise 21 scan chains with the longest chain having 11,565 scan flip-flops, each such scan flip-flop corresponding to a scan cell of the scan chain. After segmenting the scan chains, there were a total of 196 segments combined in all the scan chains and the average segment size was 994 flip-flops. The maximum segment length in this design was 11,253 flip-flops. Given the above parameters, the maximum number of segments in any scan chain was 11. Scan segments with fewer than 994 flip-flops were not further partitioned. The scan test circuitry comprised 16 scan chains with 11 segments each, one scan chain with 6 segments and another scan chain with 2 segments. All of the inputs SE, CK, Rst and Reset were brought out to chip-level pins.

For a given state of the finite state machine in this example design, in the best case one segment in each of the scan chains is bypassed and in the worst case, one segment in each of only a subset of the scan chains is bypassed. This is because not all scan chains have the same number of segments.

The test generation process of FIG. 6 was applied to generate low power test patterns. A significant reduction in power consumption and test time was achieved. For example, in a test run in which the first scan segment in each scan chain is bypassed, the number of scan cells in each chain is shorter by 994 scan cells. There is a reduction of 995 test cycles for each of the test patterns and hence a corresponding reduction in test time. In addition, the switching activity in reduced by a factor of 995*K*0.1 assuming 10% of the bypassed scan cells would be switching during each of those test patterns.

It should be understood that this design example is presented for illustration only, and numerous alternative implementations are possible.

Figure 7:
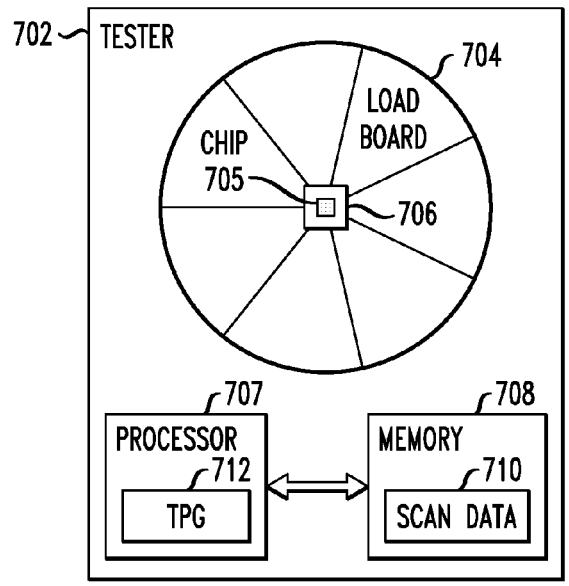
FIG. 7 shows one possible implementation of the testing system of FIG. 1.

The tester 102 in the testing system 100 of FIG. 1 need not take any particular form, and various conventional testing system arrangements can be modified in a straightforward manner to support the scan segment bypass functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
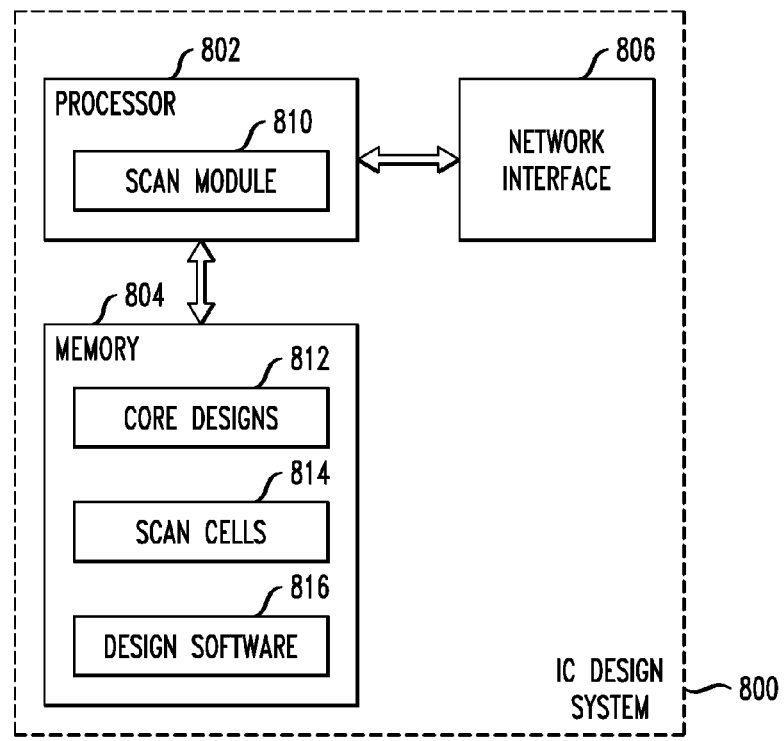
FIG. 8 is a block diagram of a processing system for generating an integrated circuit design comprising scan segment bypass circuitry of the type illustrated in FIGS. 3, 4 and 5.

The insertion of scan cells to form scan chains having associated scan segment bypass functionality in scan test circuitry of an integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having scan segment bypass circuitry comprising scan segment bypass controller 203 and associated multiplexers 302.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated scan segment bypass circuitry in the manner disclosed herein, in conjunction with utilization of integrated circuit design software 816.

By way of example, the scan chain circuitry 106 comprising scan chains 204 and associated scan segment bypass circuitry may be generated in system 800 using an RTL description and then synthesized to gate level using a specified technology library. A test generation model may then be created for generating test patterns using a test generation tool. Control files or other types of input files may be used to provide the test generation tool with information such as the manner in which the scan chains are separated into scan segments. Once the corresponding rules are in place, a rule checker may be run so that the test generation tool has visibility of the scan chains taking into account the operation of the scan segment bypass circuitry. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and scan segment bypass functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan segment bypass circuitry, logic gates, state machines and other elements, as well as different types and arrangements of scan segment bypass control signaling, state transition timing and scan test pattern generation, than those included in the embodiments described herein. These and numerous other alternative embodiments within the scope of the following claims will be readily apparent to those skilled in the art.

What is claimed is:

1. An integrated circuit comprising:
    scan test circuitry; and
    additional circuitry subject to testing utilizing the scan test circuitry;
    the scan test circuitry comprising at least one scan chain having a plurality of scan cells;
    wherein the scan chain is separated into a plurality of scan segments with each such segment comprising a distinct subset of two or more of the plurality of scan cells;
    the scan test circuitry further comprising scan segment bypass circuitry configured to selectively bypass one or more of the scan segments in a scan shift mode of operation.

2. The integrated circuit of claim 1 wherein the scan segment bypass circuitry comprises:
    a plurality of multiplexers arranged within the scan chain and configured to allow respective ones of the scan segments to be bypassed responsive to respective bypass control signals; and
    a scan segment bypass controller configured to generate said bypass control signals for application to the multiplexers.

3. The integrated circuit of claim 2 wherein the plurality of multiplexers comprises a plurality of two-to-one multiplexers.

4. The integrated circuit of claim 2 wherein a given one of the multiplexers comprises:
    a first input coupled to a scan input of a corresponding one of the scan segments;
    a second input coupled to a scan output of the corresponding one of the scan segments;
    an output coupled to a scan input of a subsequent scan segment of the scan chain; and
    a select line adapted for receiving a bypass control signal for controlling the multiplexer between at least a first state in which the corresponding scan segment is not bypassed and a second state in which the corresponding scan segment is bypassed.

5. The integrated circuit of claim 2 wherein the scan segment bypass controller comprises a finite state machine.

6. The integrated circuit of claim 5 wherein the finite state machine comprises a plurality of states including a reset state in which none of the scan segments is bypassed and a plurality of additional states in which respective ones of the scan segments are bypassed.

7. The integrated circuit of claim 6 wherein the finite state machine is configured to cycle through the states responsive to a control signal from a control signal generator of the scan segment bypass controller.

8. The integrated circuit of claim 7 wherein the control signal is configured to cause the finite state machine to move from state to state only after application of at least one test pattern to the scan chain within a given such state.

9. The integrated circuit of claim 8 wherein at least two test patterns are applied within the given state before the state machine moves to a subsequent state.

10. The integrated circuit of claim 1 wherein each of a plurality of scan chains of the scan test circuitry is separated into scan segments in substantially the same manner.

11. The integrated circuit of claim 1 wherein the scan chain is separated into scan segments such that each of the scan segments of the scan chain has a length in scan cells that is less than or equal to a specified maximum segment length.

12. A processing device comprising the integrated circuit of claim 1.

13. A method comprising:
    configuring at least one scan chain to include a plurality of scan cells, the scan chain being separated into a plurality of scan segments with each such segment comprising a distinct subset of two or more of the plurality of scan cells; and
    selectively bypassing one or more of the scan segments in a scan shift mode of operation.

14. The method of claim 13 wherein the step of selectively bypassing one or more of the scan segments comprises applying bypass control signals to respective multiplexers arranged within the scan chain and configured to allow respective ones of the scan segments to be bypassed.

15. The method of claim 14 wherein each of the multiplexers comprises a select line adapted for receiving a corresponding one of the bypass control signals for controlling the multiplexer between at least a first state in which the corresponding scan segment is not bypassed and a second state in which the corresponding scan segment is bypassed.

16. The method of claim 13 wherein the step of selectively bypassing one or more of the scan segments comprises bypassing said one or more segments under control of a finite state machine having a plurality of states including a reset state in which none of the scan segments is bypassed and a plurality of additional states in which respective ones of the scan segments are bypassed.

17. The method of claim 16 wherein the finite state machine is configured to cycle through the states responsive to a control signal.

18. The method of claim 17 wherein the control signal is configured to cause the finite state machine to move from state to state only after application of a particular number of test patterns to the scan chain within a given such state.

19. A computer program product comprising a non-transitory computer-readable storage medium having computer program code embodied therein for use in scan testing an integrated circuit, wherein the computer program code when executed in a testing system causes the testing system to perform the steps of the method of claim 13.

20. A processing system comprising:
a processor; and
a memory coupled to the processor and configured to store information characterizing an integrated circuit design;
wherein the processing system is configured to provide scan test circuitry within the integrated circuit design, the scan test circuitry comprising at least one scan chain having a plurality of scan cells;
wherein the scan chain is separated into a plurality of scan segments with each such segment comprising a distinct subset of two or more of the plurality of scan cells;
the scan test circuitry further comprising scan segment bypass circuitry configured to selectively bypass one or more of the scan segments in a scan shift mode of operation.

* * * * *